United States Patent
Sugino et al.

(10) Patent No.: US 9,504,193 B2
(45) Date of Patent: Nov. 22, 2016

(54) SHIELDED CONDUCTIVE PATH

(71) Applicant: SUMITOMO WIRING SYSTEMS, LTD., Yokkaichi, Mie (JP)

(72) Inventors: Hidetoshi Sugino, Yokkaichi (JP); Masanori Kuwahara, Yokkaichi (JP); Hidehiko Iwakawa, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/619,833

(22) Filed: Feb. 11, 2015

(65) Prior Publication Data

US 2015/0250079 A1    Sep. 3, 2015

(30) Foreign Application Priority Data

Mar. 3, 2014   (JP) ................................. 2014-040397

(51) Int. Cl.
*H05K 9/00* (2006.01)

(52) U.S. Cl.
CPC .......... *H05K 9/0009* (2013.01); *H05K 9/0049* (2013.01); *H05K 9/0098* (2013.01)

(58) Field of Classification Search
CPC .................................................. H05K 9/0098
See application file for complete search history.

(56) References Cited

U.S. PATENT DOCUMENTS

| | | | | |
|---|---|---|---|---|
| 6,933,440 B2* | 8/2005 | Ichikawa | ............ | B60R 16/0215 174/135 |
| 2004/0099427 A1 | 5/2004 | Kihira | | |
| 2005/0045357 A1* | 3/2005 | Ichikawa | ............ | B60R 16/0215 174/50 |
| 2009/0120681 A1* | 5/2009 | Matsuzaki | .............. | H01F 17/06 174/350 |
| 2010/0126752 A1* | 5/2010 | Watanabe | ............ | H05K 9/0098 174/102 D |
| 2010/0212952 A1* | 8/2010 | Abdelmoula | .......... | H01B 1/026 174/390 |
| 2013/0105215 A1* | 5/2013 | Morris | ................. | H02G 3/0412 174/394 |
| 2013/0112473 A1* | 5/2013 | Toyama | .............. | B60R 16/0215 174/350 |
| 2013/0168149 A1* | 7/2013 | Gundel | ................ | H01B 7/0861 174/350 |
| 2013/0175079 A1* | 7/2013 | Adachi | ............... | B60R 16/0215 174/350 |

FOREIGN PATENT DOCUMENTS

JP           2004-171952 A       6/2004

* cited by examiner

*Primary Examiner* — Hung V Ngo
(74) *Attorney, Agent, or Firm* — Oliff PLC (57) ABSTRACT

A shielded conductive path that can facilitate manufacturing operations is provided. A shielded conductive path includes a shielding pipe that is configured to have a tubular shape into which an electric wire can be inserted, by combining together a pair of divided bodies into which the shielding pipe is divided along its axis, and an overlapping fitting portion that is provided at a joint portion of the pair of divided bodies and allows the pair of divided bodies to be fitted to each other while overlapping each other in an inside-outside direction when the pair of divided bodies are combined together. Thus, the operations for manufacturing the shielded conductive path can be performed easily.

17 Claims, 7 Drawing Sheets

SHIELDED CONDUCTIVE PATH

TECHNICAL FIELD

The present application relates to a shielded conductive path having a shielding function.

BACKGROUND

Conventionally, in vehicles such as hybrid vehicles, electric wires are routed under the floor of a vehicle in order to connect, for example, devices, such as a high-voltage battery, provided in a rear portion of the vehicle to devices, such as an inverter and a fuse box, provided in a front portion of the vehicle. In that case, a shielded conductive path is known which is used for the purpose of protection of the electric wires and noise shielding and which is configured by inserting the electric wires into a metal pipe and bending the pipe into a predetermined shape that conforms to a wiring route of the electric wires (see JP 2004-171952A, for example).

JP 2004-171952A is an example of related art.

However, in manufacturing operations of a shielded conductive path that is configured as described above, it is necessary to insert electric wires into an extremely long pipe extending from a front portion to a rear portion of a vehicle, and therefore there is a problem in that the manufacturing operations are difficult.

SUMMARY

The present application was prepared at least in part in view of the circumstances as described above, and it is an object thereof to provide a shielded conductive path that can facilitate manufacturing operations.

A shielded conductive path according to some embodiments includes a shielding pipe having a tubular shape into which an electric wire can be inserted, the shielding pipe formed by combining a pair of divided bodies, the shielding pipe being divided along an axis of the divided bodies, and an overlapping fitting portion that is provided at a joint portion of the pair of divided bodies and allows the pair of divided bodies to be fitted to each other while overlapping each other in an inside-outside direction when the pair of divided bodies are combined together.

According to the some embodiments, a state in which the electric wire is inserted into the shielding pipe is achieved by placing the electric wire along the inside of one of the pair of divided bodies and then combining the other divided body with that divided body, and therefore the operation for inserting the electric wire may no longer be necessary. Also, the pair of divided bodies that are combined together are unlikely to be displaced from each other due to the overlapping fitting portion provided at the joint portion, and therefore handling may be easy when compared with a case where the pair of divided bodies are displaced easily. Accordingly, the operations for manufacturing the shielded conductive path may be performed easily.

DETAILED DESCRIPTION

According to the shielded conductive path of some embodiments, the overlapping fitting portion may be formed on only an inner surface of the shielding pipe. With this configuration, the shielding pipe can have the same external shape as the external shape of a conventional shielding pipe, and therefore bending of the shielding pipe can be performed using a conventional pipe bender.

Moreover, according to the shielded conductive path of some embodiments, the shielding pipe may be provided with an electric wire protecting portion that covers a corner portion of the overlapping fitting portion, the corner portion being formed inside the shielding pipe. With this configuration, the electric wire does not come into contact with the corner portion that is formed inside the shielding pipe, and therefore the electric wire can be prevented from coming into contact with and being damaged by the corner portion.

Moreover, according to the shielded conductive path of some embodiments, the shielding pipe may be provided with a closing portion that extends from one of the pair of divided bodies across the inside of the joint portion to the side of the other divided body. With this configuration, even if a gap is formed at the joint portion of the pair of divided bodies due to bending of the shielding pipe, the gap may be closed by the closing portion, and therefore protection of the electric wire and noise shielding can be achieved more reliably.

Moreover, according to the shielded conductive path of some embodiments, the shielding pipe may be provided with a holding portion that holds a leading end of the electric wire protecting portion or the closing portion from an inner side. With this configuration, even if the electric wire protecting portion or the closing portion is to be bent to the inner side clue to bending of the shielding pipe, the leading end thereof may be held by the holding portion, and therefore a situation in which the leading end of the electric wire protecting portion or the closing portion protrudes inward and causes damage to the electric wire can be prevented.

Moreover, according to the shielded conductive path of some embodiments, the pair of divided bodies may have substantially the same shape. With this configuration, the manufacturing cost of the shielded conductive path can be reduced when compared with the case of a shielding pipe having divided bodies with different shapes.

Moreover, according to the shielded conductive path of some embodiments, it is also possible that the shielding pipe may be provided with a partition constituent wall that partitions an interior of the shielding pipe into a plurality of electric wire insertion spaces, and the partition constituent wall may be provided in only one of the pair of divided bodies and extends from an inner circumferential surface of that divided body so as to partition an interior of that divided body into the same number of spaces as the electric wire insertion spaces.

With this configuration, a state in which electric wires are inserted into the plurality of electric wire insertion spaces that are formed within the shielding pipe may be achieved by placing the electric wires in the respective spaces of one of the divided bodies that is partitioned by the partition constituent wall and then combining the other divided body with that divided body. Accordingly, the operation for inserting the electric wires into the plurality of electric wire insertion spaces that are formed within the shielding pipe is no longer necessary, and therefore the operations for manufacturing the shielded conductive path can be performed easily.

Moreover, according to the shielded conductive path of some embodiments, it is also possible that the shielding pipe is provided with a partition wall that partitions an interior of the shielding pipe into a plurality of electric wire insertion spaces, the partition wall may be formed by partition constituent walls that are provided in both of the pair of divided bodies being laid on top of each other when the pair of divided bodies are combined together, and leading end portions of the partition constituent walls are disposed overlapping each other. With this configuration, a gap is unlikely to be formed between the partition constituent walls even when bending of the shielding pipe is performed, and therefore, leakage of noise from one electric wire insertion space to another electric wire insertion space can be prevented reliably.

According to the shielded conductive path of some embodiments, the divided body may have a drain hole that is formed from a side that constitutes an inner circumferential surface of the shielding pipe toward the opposite side. With this configuration, no burrs are formed on the inner circumferential surface of the shielding pipe, and therefore the electric wire can be prevented from coming into contact with and being damaged by the burrs.

Embodiment 1

Figure 1:
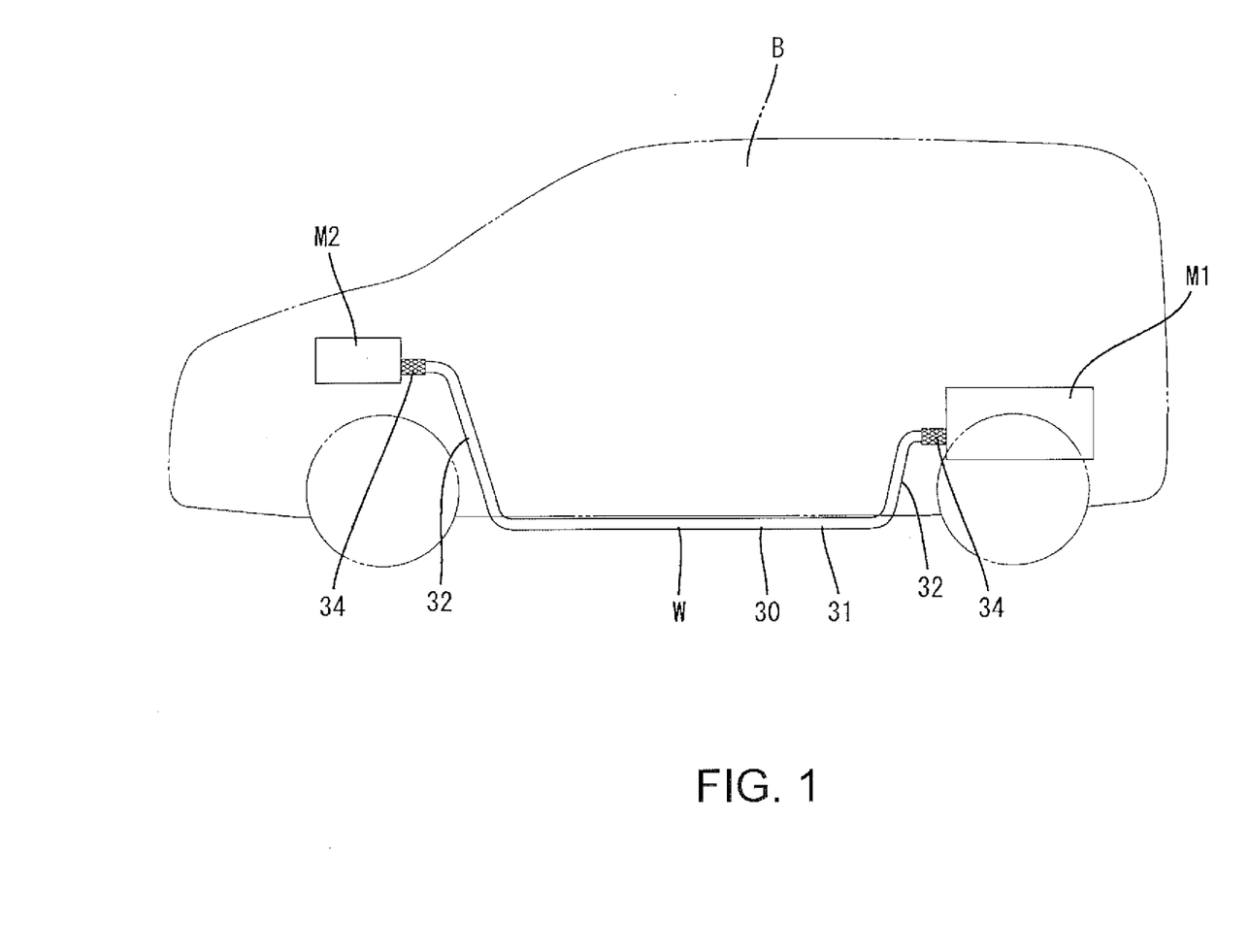
FIG. 1 is a schematic side view showing a wiring route of a shielded conductive path according to Embodiment 1.

Hereinafter, Embodiment 1 of the present application will be described in detail with reference to FIGS. 1 to 4. As shown in FIG. 1, a shielded conductive path W of this embodiment is routed under the floor of a vehicle body B of a vehicle, such as a hybrid vehicle, in order to connect, for example, a device M1, such as a high-voltage battery, that is provided in a rear portion of the vehicle body B to a device M2, such as an inverter or a fuse box, that is provided in a front portion of the vehicle body B. It should be noted that the devices M1 and M2 are accommodated in conductive shielding cases, respectively.

The shielded conductive path W of this embodiment may be configured by inserting a plurality of (two, in this embodiment) electric wires 10 into a shielding pipe 30 that is formed by combining a pair of divided bodies 20 together. Each electric wire 10 may be a non-shielded electric wire that may be configured by enclosing an outer circumference of a conductor with an insulating coating, and terminal fittings, which are not shown, may be connected to the ends of the electric wire 10. The terminal fittings may be accommodated in respective connectors C, and the connectors C may be connected to the respective devices M1 and M2 (see FIG. 2).

Figure 3:
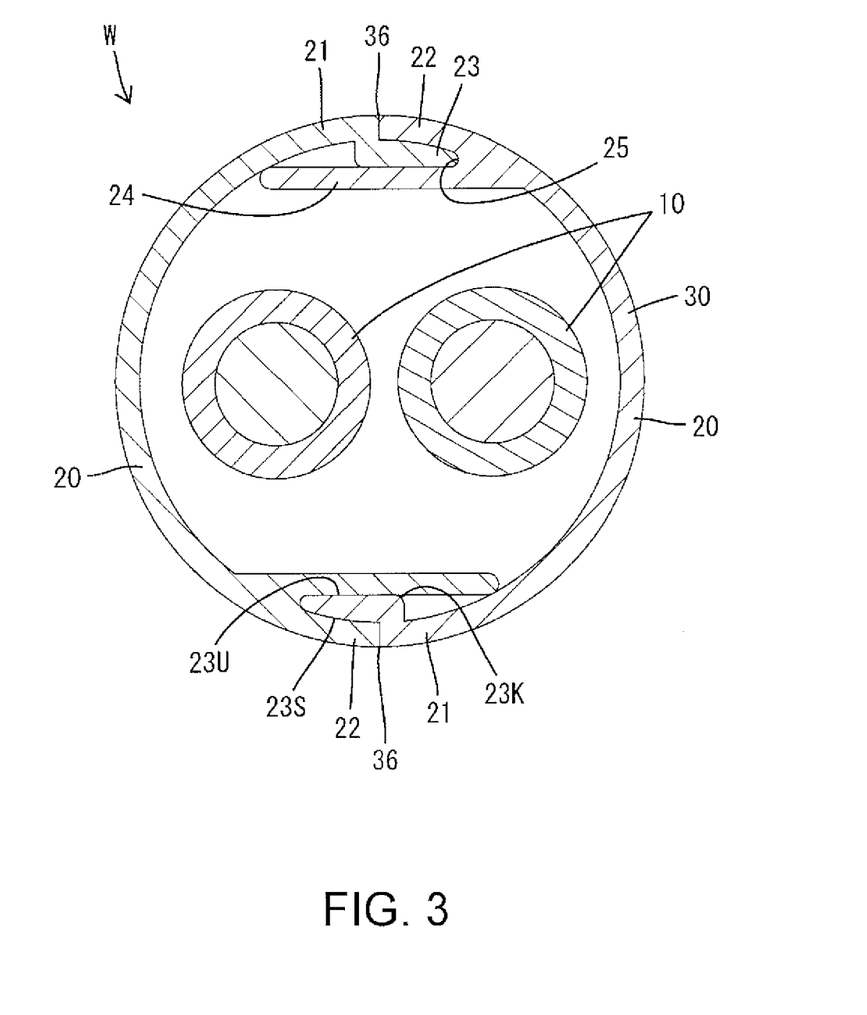
FIG. 3 is a cross-sectional view showing the configuration of the shielded conductive path and corresponding to a cross section at a position indicated by A-A in FIG. 2.
Figure 4:
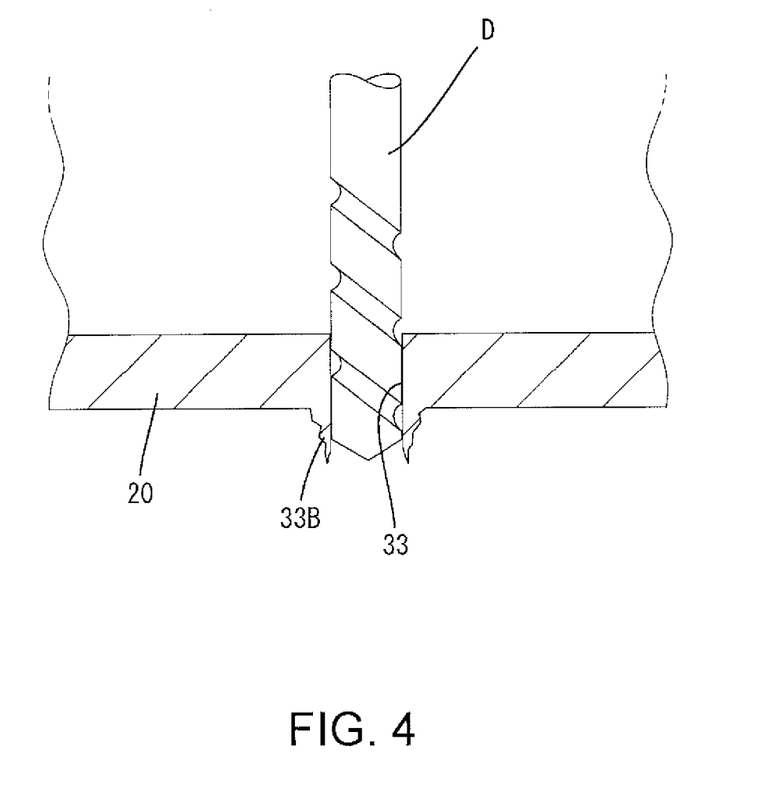
FIG. 4 is a partially enlarged cross-sectional view showing how a drain hole is formed in a divided body.

The shielding pipe 30 may be made of a metal (iron, aluminum, copper, stainless steel, or the like) and may have a tubular shape that encloses the two electric wires 10 collectively (see FIG. 3). The shielding pipe 30 may be bent in three dimensions along a wiring route of the electric wires 10. According to this embodiment, as shown in FIG. 1, the shielding pipe 30 may have a lowermost portion 31 that is generally routed at the lowermost position of the wiring route and rising portions 32 that may extend upward from both ends of the lowermost portion 31 toward the devices M1 and M2, respectively. A drain hole 33 through which water collected inside the shielding pipe 30 due to condensation or the like is discharged to the outside may be formed in a lower surface of the lowermost portion 31. This drain hole 33 is formed by, as shown in FIG. 4, making a hole in the divided body 20 from a surface thereof that is to be located on the inner side of the shielding pipe 30 to the opposite surface (surface that is to be located on the outer side) using a drill D or the like.

Figure 2:
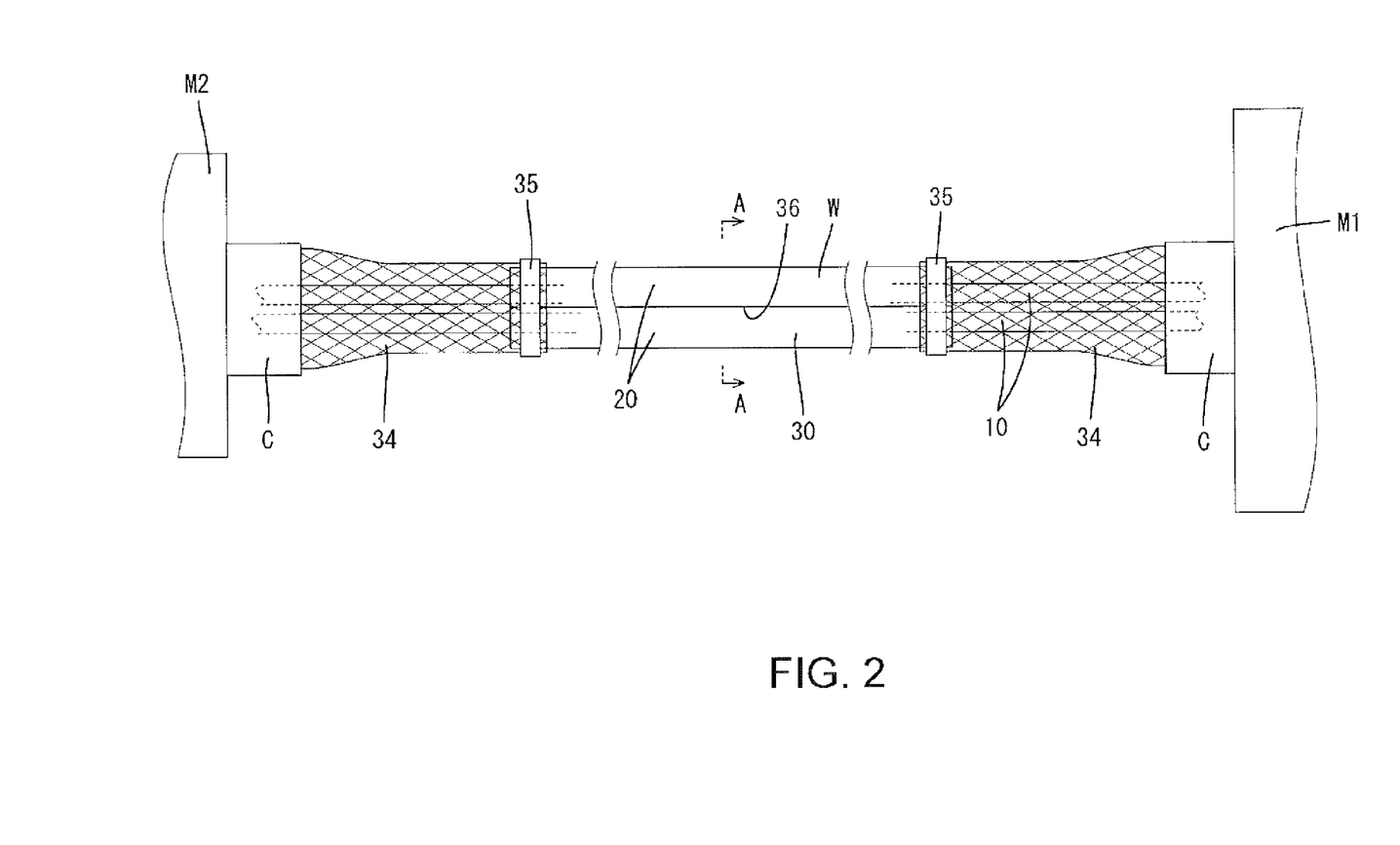
FIG. 2 is a schematic side view showing a state in which the shielded conductive path is connected to devices.

Portions of the electric wires 10 that are led out of each end of the shielding pipe 30 may be collectively enclosed by a braided member 34, as shown in FIG. 2. The braided member 34 may be formed by braiding a conductive thin metal wire (e.g., copper) into a mesh (e.g., a tube-shaped mesh). It should be noted that those portions may also be wrapped with a metal foil or the like instead of the braided member 34. One end side of the braided member 34 may be fixed to an outer circumferential surface of the shielding pipe 30 by crimping with a metal band 35 so that electrical continuity can be established, and the other end side may be fixed to the corresponding connector C so that electrical continuity can be established.

The pair of divided bodies 20 constituting the shielding pipe 30 are the bodies into which the shielding pipe 30 is divided along its axis, and may have the same shape. The divided bodies 20 are formed by extrusion molding. Each divided body 20 may have a semicircular cross-sectional shape as shown in FIG. 3, and the pair of divided bodies 20 may be combined together in such a manner that both edge portions of one of the pair of divided bodies 20 in a circumferential direction are joined to both edge portions of the other divided body 20. Hereinafter, portions of the shielding pipe 30 where the pair of divided bodies 20 are joined to each other will be referred to as joint portions 36.

The pair of divided bodies 20 are combined together in such a manner that one edge portion (hereinafter referred to as a first edge portion 21) and the other edge portion (hereinafter referred to as a second edge portion 22) of the two edge portions of one of the pair of divided bodies 20 may be arranged to be inverted from those of the other divided body 20, or in other words, the first edge portion 21 of one of the pair of divided bodies 20 is joined to the second edge portion 22 of the other divided body 20 and the second edge portion 22 joined to the first edge portion 21 of the other divided body 20.

At the joint portions 36 of the pair of divided bodies 20, overlapping fitting portions 23 may be provided which, when the pair of divided bodies 20 are combined together, allow the pair of divided bodies 20 to be fitted to each other while overlapping each other in an inside-outside direction. The overlapping fitting portions 23 may be formed on only an inner surface of the shielding pipe 30, and the external shape of the shielding pipe 30 thus may be a circle similar to that of a conventional shielding pipe.

Each overlapping fitting portion 23 may be provided on the side of the first edge portion 21 of the corresponding divided body 20. The overlapping fitting portion 23 may be provided extending in a direction in which the divided bodies 20 are combined together from a position that is shifted inward so that the entire overlapping fitting portion 23 is positioned to the inside of the first edge portion 21. A corner portion 23K that may make a substantially right angle is formed at a base portion (connecting portion connected to the first edge portion 21) of the overlapping fitting portion 23.

When the pair of divided bodies 20 are combined together, each overlapping fitting portion 23 may be fitted inside the second edge portion 22 of the counterpart divided body 20. An outer surface 23S of the overlapping fitting portion 23 may have an arc shape that conforms to an inner circumferential surface of the second edge portion 22, and an inner surface 23U of the overlapping fitting portion 23 may be a flat surface rather than having an arc shape. The overlapping fitting portion 23 may be provided extending continuously over the entire length of the first edge portion 21 (i.e., the entire length of the divided body 20).

A multifunctional portion 24 serving as both an electric wire protecting portion that covers the corner portion 23K of the overlapping fitting portion 23 and a closing portion that closes a gap at the joint portion 36 may be provided on the side of the second edge portion 22 of each divided body 20. The multifunctional portion 24 may have a flat plate shape extending in the direction in which the divided bodies 20 are combined together with a space into which the overlapping fitting portion 23 can be fitted being left between the multifunctional portion 24 and the second edge portion 22. When the pair of divided bodies 20 are combined together, the multifunctional portion 24 may extend across the inside of the corresponding joint portion 36 to the counterpart divided body 20. The dimensions of the multifunctional portion 24 are set so that a leading end (protruding end) of the multifunctional portion 24 may abut against or come close to the inner circumferential surface of the counterpart divided body 20. The multifunctional portion 24 is provided extending over the entire length of the divided body 20. The overlapping fitting portion 23 may be fitted into a groove portion 25 with almost no gap formed in the inside-outside direction and the circumferential direction, the groove portion 25 being formed between the second edge portion 22 and the multifunctional portion 24.

Next, an example of the operations for manufacturing the shielded conductive path W according to this embodiment will be described. First, the electric wires 10 may be accommodated in one of the pair of divided bodies 20. At this time, the two or more electric wires 10 can be easily accommodated without the conventional need to be wrapped around with tape.

Then, the other divided body 20 may be combined with that divided body 20. When the pair of divided bodies 20 are fitted to each other with the first edge portion 21 of one of the pair of divided bodies 20 facing the second edge portion 22 of the other divided body 20, and vice versa, the overlapping fitting portions 23 in the first edge portions 21 may be fitted into the respective groove portions 25 in the respective second edge portions 22. Thus, at each joint portion 36 of the pair of divided bodies 20, the second edge portion 22, the overlapping fitting portion 23, and the multifunctional portion 24 may be laid one on top of another in that order from the outer side with almost no gap therebetween. When the pair of divided bodies 20 are combined together, the shielding pipe 30 having a cylindrical shape may be formed, and a state in which the electric wires 10 pass through the shielding pipe 30 may be achieved.

Next, the shielding pipe 30 through which the electric wires 10 pass is bent into a predetermined shape. At this time, because the external shape of the shielding pipe 30 is a circle similar to that of a conventional shielding pipe, a conventionally used pipe bender can be used as it is. At this time, displacement of the pair of divided bodies 20 at the joint portions 36 may be prevented by the overlapping fitting portions 23, and therefore the operations can be performed easily.

Moreover, if one of the joint portions 36 of the pair of divided bodies 20 is located on the outer side of the bend, a large force that deforms the first edge portion 21 and the second edge portion 22 may be exerted on that joint portion 36 located on the outer side of the bend. However, both the first edge portion 21 and the second edge portion 22 have increased rigidity due to the overlapping fitting portion 23 being fitted thereto and are therefore unlikely to be deformed even when the large force is exerted thereon. Also, even if the first edge portion 21 and the second edge portion 22 are deformed and a gap is formed therebetween, the gap may be closed by the multifunctional portion 24, and therefore exposure of the electric wires 10 and leakage of noise can be prevented.

Moreover, even if the electric wires 10 come into contact with the inner circumferential surface of the shielding pipe 30 due to bending of the shielding pipe 30, the electric wires 10 can be prevented from coming into contact with and being damaged by the corner portions 23K of the overlapping fitting portions 23 because the corner portions 23K of the overlapping fitting portions 23 may be covered by the multifunctional portions 24. Furthermore, the leading ends of the multifunctional portions 24 may be located close to the inner circumferential surface of the shielding pipe 30 and may not protrude to the inside of the shielding pipe 30, and therefore the electric wires 10 can be prevented from coming into contact with and being damaged by the leading ends of the multifunctional portions 24.

In this manner, the shielding pipe 30 may be plastically deformed into a predetermined shape by bending, and the pair of divided bodies 20 are kept in the combined state. Thus, the operations for manufacturing the shielded conductive path W are completed.

Next, the effects of this embodiment that is configured as described above will be described. The shielded conductive path W of this embodiment includes the electric wires 10 and the shielding pipe 30, which may be configured to have a tubular shape into which the electric wires 10 can be inserted, by combining together the pair of divided bodies 20 into which the shielding pipe 30 is divided along its axis, and the overlapping fitting portions 23, which allow the pair of divided bodies 20 to be fitted to each other while overlapping each other in the inside-outside direction when combined together, may be provided at the joint portions 36 of the pair of divided bodies 20.

With this configuration, the operation for inserting the electric wires 10 may no longer be necessary because a state in which the electric wires 10 are inserted into the shielding pipe 30 is achieved by placing the electric wires 10 along the inside of one of the pair of divided bodies 20 and then combining the other divided body 20 with that divided body 20. Moreover, the pair of divided bodies 20 after being combined together are unlikely to be displaced from each other due to the overlapping fitting portions 23 provided at the joint portions 36, and therefore handling is easy when compared with a case where the pair of divided bodies 20 are displaced easily. Accordingly, the operations for manufacturing the shielded conductive path W can be performed easily.

Moreover, the overlapping fitting portions 23 may be formed on only the inner surface of the shielding pipe 30. With this configuration, the shielding pipe 30 can have the same external shape as that of a conventional shielding pipe, and therefore bending of the shielding pipe 30 can be performed using a conventional pipe bender.

Moreover, the shielding pipe 30 may be provided with the multifunctional portions 24 that cover the corner portions 23K of the respective overlapping fitting portions 23, the corner portions 23K being formed inside the shielding pipe 30. With this configuration, the electric wires 10 may not necessarily come into contact with the corner portions 23K, which are formed inside the shielding pipe 30, and therefore the electric wires 10 can be prevented from coming into contact with and being damaged by the corner portions 23K.

Moreover, the shielding pipe 30 may be provided with the multifunctional portions 24, each multifunctional portion 24 extending from one of the pair of divided bodies 20 across the inside of the corresponding joint portion 36 to the side of the other divided body 20. With this configuration, even if a gap is formed at the joint portion 36 of the pair of divided bodies 20 as a result of bending of the shielding pipe 30, the gap may be closed by the closing portion, and therefore protection of the electric wires 10 and noise shielding can be achieved more reliably.

Moreover, the pair of divided bodies 20 may have the same shape, and therefore the manufacturing cost of the shielded conductive path W can be reduced when compared with, for example, the case of a shielding pipe that is constituted by divided bodies having different shapes.

Moreover, the divided body 20 has the drain hole 33 that may be formed from the inner side toward the outer side. In a conventional shielding pipe that is closed in the circumferential direction, there is no option but to form a hole from the outer side toward the inner side of the shielding pipe using the drill D or the like, and thus there is a risk that burrs may be formed on the inner surface of the shielding pipe and may cause damage to the electric wires inserted into the shielding pipe. However, with the configuration of this embodiment, it is possible to form a hole from the surface of the divided body 20 that is to be located on the inner side of the shielding pipe 30 toward the outer side using the drill D or the like, and therefore, as shown in FIG. 4, burrs 33B are formed on the outer side of the shielding pipe 30. Accordingly, the electric wires 10 can be prevented from coming into contact with and being damaged by the burrs 33B.

Embodiment 2

Figure 5:
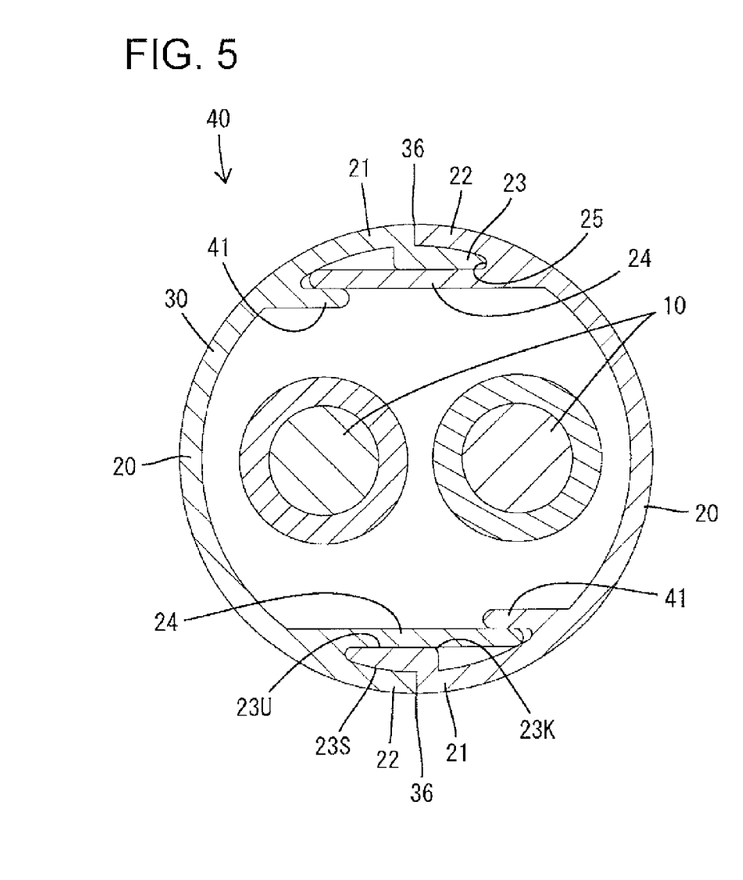
FIG. 5 is a cross-sectional view showing the configuration of a shielded conductive path according to Embodiment 2.

Next, a shielded conductive path 40 according to Embodiment 2 of the present application will be described using FIG. 5. The shielded conductive path 40 of this embodiment differs from that of Embodiment 1 in that the shielding pipe 30 is provided with holding portions 41 that hold the leading ends of the respective multifunctional portions 24 from the inner side. It should be noted that the same components as those of Embodiment 1 are denoted by the same reference numerals, and redundant descriptions thereof are omitted.

Similarly to Embodiment 1, the shielded conductive path 40 according to this embodiment may be configured by inserting two or more electric wires 10 into the shielding pipe 30 that is formed by combining together the pair of divided bodies 20 having substantially the same shape. At the joint portions 36 of the pair of divided bodies 20, similarly to Embodiment 1, the overlapping fitting portions 23 may be provided, which allow the pair of divided bodies 20 to be fitted to each other while overlapping each other in the inside-outside direction when combined together. Moreover, similarly to Embodiment 1, the shielding pipe 30 may be provided with the multifunctional portions 24, each of which may serve as both the electric wire protecting portion that covers the corner portion 23K of the corresponding overlapping fitting portion 23 and the closing portion that extends across the inside of the corresponding joint portion 36 to the side of the other divided body 20.

In addition, the shielding pipe 30 may be provided with the holding portions 41 that hold the leading ends of the respective multifunctional portions 24 from the inner side. Each of the holding portions 41 may be provided on the side of the first edge portion 21 of the corresponding divided body 20. The holding portion 41 may be provided so as to extend from the inner circumferential surface of the divided body 20 in the direction in which the divided bodies 20 are combined together. The holding portion 41 may be provided extending over the entire length of the divided body 20. When the pair of divided bodies 20 are combined together, the holding portion 41 may be laid on the inner side of a leading end portion of the corresponding multifunctional portion 24. Specifically in this embodiment, the holding portion 41 may be laid on the inner side of approximately a half of the area of a portion of the multifunctional portion 24 of the counterpart divided body 20 that extends toward the divided body 20 beyond the overlapping fitting portion 23 of the divided body 20.

As described above, according to this embodiment, the shielding pipe 30 may be provided with the holding portions 41 that hold the leading ends of the respective multifunctional portions 24 from the inner side. Thus, even if an excessively large force is exerted on the joint portion 36 due to bending of the shielding pipe 30 and attempts to bend the multifunctional portion 24 inward, the leading end of the multifunctional portion 24 may be held by the holding portion 41, and therefore a situation in which the leading end of the multifunctional portion 24 protrudes inward and causes damage to the electric wires 10 can be prevented.

Embodiment 3

Figure 6:
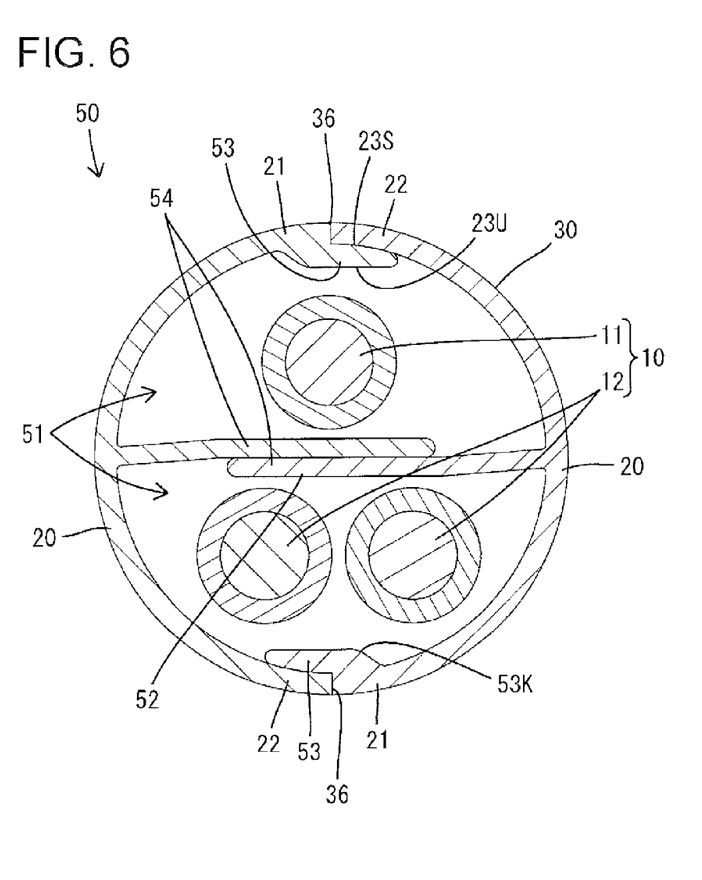
FIG. 6 is a cross-sectional view showing the configuration of a shielded conductive path according to Embodiment 3.

Next, a shielded conductive path 50 according to Embodiment 3 of the present application will be described using FIG. 6. The shielded conductive path 50 of this embodiment differs from that of Embodiment 1 in that a partition wall 52 that partitions the interior of the shielding pipe 30 into a plurality of electric wire insertion spaces 51 may be provided. It should be noted that the same components as those of Embodiment 1 are denoted by the same reference numerals, and redundant descriptions thereof are omitted.

Similarly to Embodiment 1, the shielded conductive path 50 according to this embodiment may be configured by inserting a plurality of (three, in this embodiment) electric wires 10 into the shielding pipe 30 that is formed by combining together the pair of divided bodies 20 having substantially the same shape. At the joint portions 36 of the pair of divided bodies 20, similarly to Embodiment 1, overlapping fitting portions 53 may be provided which allow the pair of divided bodies 20 to be fitted to each other while overlapping each other in the inside-outside direction when combined together.

The shielding pipe 30 of this embodiment may not be provided with the multifunctional portions 24 described in Embodiment 1, and the shape of the overlapping fitting portions 53 may differ from the shape of the overlapping fitting portions 23 of Embodiment 1. The overlapping fitting portions 53 of this embodiment may have even more increased rigidity due to the connecting portions connected to the first edge portions 21 having a larger thickness than those of the overlapping fitting portions 23 of Embodiment 1. Moreover, corner portions 53K of the overlapping fitting portions 53 may be formed so as to make an obtuse angle, and thus have a very gentle shape when compared with the corner portions 23K of the overlapping fitting portions 23 of Embodiment 1.

The three electric wires 10 are constituted by a first electric wire 11 and a second electric wire 12 that are of different kinds (functions). The first electric wire 11 may be an electric wire constituting, for example, a low-tension circuit, while the second electric wire 12 may be an electric wire constituting, for example, a high-tension circuit. It should be noted that in this embodiment, a single first electric wire 11 and two second electric wires 12 are used, though other combinations may also be used.

The interior of the shielding pipe 30 may be partitioned into two electric wire insertion spaces 51 by the partition wall 52 in order to separate the first electric wire 11 from the second electric wires 12 so as not to be easily affected by the noise of the second electric wires 12. The partition wall 52 may be provided extending over the entire length of the shielding pipe 30. The partition wall 52 may extend across the shielding pipe 30 while passing through the axis of the shielding pipe 30, and the two electric wire insertion spaces 51 may have equal dimensions.

The partition wall 52 is formed by partition constituent walls 54 that are provided in both of the pair of divided bodies 20 being joined to each other when the pair of divided bodies 20 are combined together. Each of the partition constituent walls 54 may be provided to start from approximately the center of the corresponding divided body 20 in its width direction (circumferential direction) and extend in a fitting direction in which the divided bodies 20 are fitted to each other so that the interior of that divided body 20 may be partitioned into two spaces. The partition constituent wall 54 may have a flat plate shape extending substantially upright from the inner circumferential surface of the divided body 20. The partition constituent wall 54 may be provided extending over the entire length of the divided body 20.

A leading end portion of the partition constituent wall 54 may extend further in the direction in which the divided bodies 20 are combined together than the first edge portion 21 and the second edge portion 22 of the divided body 20, and when the pair of divided bodies 20 are combined together, the leading end portions of the partition constituent walls 54 may be disposed overlapping each other in a central portion of the shielding pipe 30. The pair of partition constituent walls 54 overlap each other in a state in which their plate surfaces are in surface contact with each other so that no gap is left therebetween. In this embodiment, the overlapping area of the pair of partition constituent walls 54 may be set to be larger than the overlapping area of the overlapping fitting portion 53 and the second edge portion 22.

As described above, according to this embodiment, each partition constituent wall 54 constituting the partition wall 52 of the shielding pipe 30 may be provided extending so as to partition the interior of the corresponding divided body 20 into two spaces, and therefore a state in which the first electric wire 11 and the second electric wires 12 are inserted into the two electric wire insertion spaces 51 can be achieved by placing the electric wires 10 in the spaces of one of the pair of divided bodies 20 into which the divided body 20 may be partitioned by the partition constituent wall 54 and combining the other divided body 20 with that divided body 20. Accordingly, the conventional operation for inserting electric wires into narrow electric wire insertion spaces within a shielding pipe, into which the shielding pipe is partitioned, may no longer be necessary, and therefore the operations for manufacturing the shielded conductive path 50 can be performed easily.

Moreover, the leading end portions of the partition constituent walls 54 that are provided in both of the pair of divided bodies 20 may be disposed overlapping each other, and therefore a gap is unlikely to be formed between the partition constituent walls 54 even when bending of the shielding pipe 30 is performed. Accordingly, leakage of noise from one of the electric wire insertion spaces 51 to the other electric wire insertion space 51 can be prevented reliably.

Embodiment 4

Figure 7:
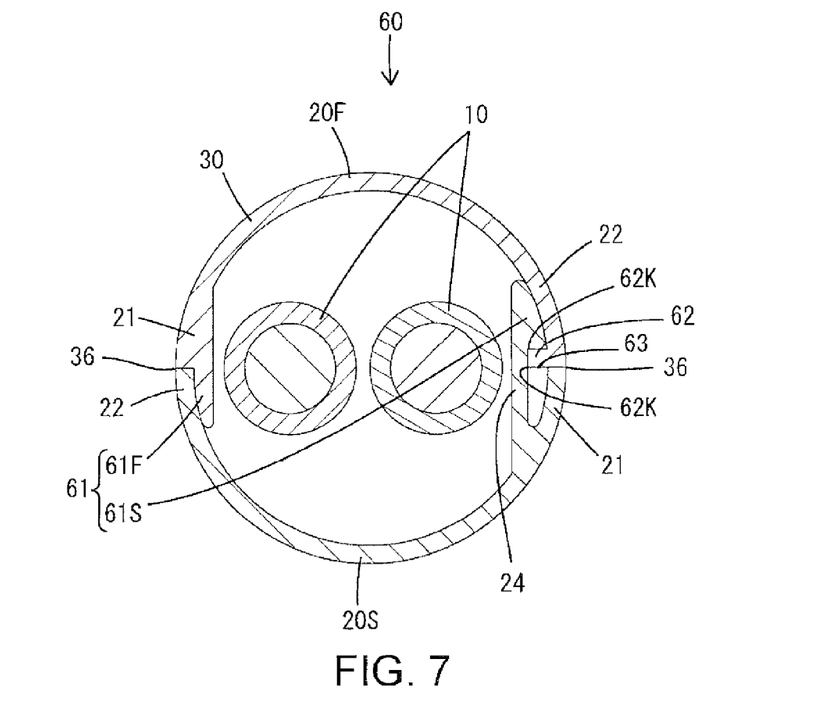
FIG. 7 is a cross-sectional view showing the configuration of a shielded conductive path according to Embodiment 4.

Next, a shielded conductive path 60 according to Embodiment 4 of the present application will be described using FIG. 7. The shielded conductive path 60 of this embodiment differs from that of Embodiment 1 in that a first divided body 20F and a second divided body 20S having different shapes are used as the pair of divided bodies 20. It should be noted that the same components as those of Embodiment 1 are denoted by the same reference numerals, and redundant descriptions thereof are omitted.

Similarly to Embodiment 1, the shielded conductive path 60 of this embodiment includes the shielding pipe 30 that is configured to have a tubular shape into which the electric wires 10 can be inserted, by combining together the first divided body 20F and the second divided body 20S into which the shielding pipe 30 is divided along its axis. At the joint portions 36 of the pair of divided bodies 20F and 20S, similarly to Embodiment 1, overlapping fitting portions 61 may be provided that allow the pair of divided bodies 20F and 20S to be fitted to each other while overlapping each other in the inside-outside direction when combined together.

The overlapping fitting portions 61 may be provided in the first edge portion 21 of the first divided body 20F and the first edge portion 21 of the second divided body 20S. Hereinafter, the overlapping fitting portion 61 provided in the first divided body 20F will be referred to as a first overlapping fitting portion 61F, and the overlapping fitting portion 61 provided in the second divided body 20S will be referred to as a second overlapping fitting portion 61S.

The first overlapping fitting portion 61F may be provided, similarly to the overlapping fitting portions 23 of Embodiment 1, so as to extend in the direction in which the divided bodies 20F and 20S are combined together from a position that is shifted inward so that the entire overlapping fitting portion 61F is positioned to the inside of the first edge portion 21. An inner surface of the first overlapping fitting portion 61F may be a flat surface that extends in the direction in which the divided bodies 20F and 20S are combined together to an inner circumferential surface of the second divided body 20S.

When the pair of divided bodies 20F and 20S are combined together, the first overlapping fitting portion 61F may be fitted inside the second edge portion 22 of the second divided body 20S. An outer surface of the first overlapping fitting portion 61F may have an arc shape that conforms to the inner circumferential surface of the second edge portion 22.

The second overlapping fitting portion 61S may be provided at a protruding end portion of the multifunctional portion 24 that extends from the inner circumferential surface of the second divided body 20S in the direction in which the divided bodies 20F and 20S are combined together and that may serve as both the electric wire protecting portion that covers corner portions 62K of a locking protrusion 62 of the first divided body 20F, which will be described later, and the closing portion that closes a gap at the joint portion 36. The multifunctional portion 24 may have a flat plate shape extending in the direction in which the divided bodies 20F and 20S are combined together. When the pair of divided bodies 20F and 20S are combined together, the multifunctional portion 24 may extend across the inside of that joint portion 36 to the side of the first divided body 20F. The dimensions of the multifunctional portion 24 may be set so that the leading end (protruding end) of the multifunctional portion 24 abuts against or comes close to the inner circumferential surface of the first divided body 20F. The multifunctional portion 24 may be provided extending over the entire length of the second divided body 20S.

The second overlapping fitting portion 61S may be provided to protrude to the outside of the multifunctional portion 24. When the pair of divided bodies 20F and 20S are combined together, the second overlapping fitting portion 61S may be fitted inside the second edge portion 22 of the first divided body 20F. An outer surface of the second overlapping fitting portion 61S may have an arc shape that conforms to the inner circumferential surface of the second edge portion 22 of the first divided body 20F.

Moreover, when the pair of divided bodies 20F and 20S are combined together, the second overlapping fitting portion 61S may be locked with the locking protrusion 62 provided on the first divided body 20F. The locking protrusion 62 may be provided to extend along an end surface of the second edge portion 22 of the first divided body 20F and protrude inward. The locking protrusion 62 may have a substantially square cross-sectional shape, and the corner portions 62K that make substantially right angles may be formed at a protruding end of the locking protrusion 62. The second overlapping fitting portion 61S and the locking protrusion 62 may be locked with each other at a locking surface 63 that is substantially perpendicular to the direction in which the divided bodies 20F and 20S are combined together.

The first overlapping fitting portion 61F, the second overlapping fitting portion 61S, and the locking protrusion 62 may be individually provided extending continuously over the entire length of the first divided body 20F or the second divided body 20S. Also, all of the first overlapping fitting portion 61F, the second overlapping fitting portion 61S, and the locking protrusion 62 may be formed on only the inner surface of the shielding pipe 30, and the external shape of the shielding pipe 30 is thus a circle similar to that of a conventional shielding pipe.

As described above, according to this embodiment, similarly to Embodiment 1, the operation for inserting the electric wires 10 may no longer be necessary because a state in which the electric wires 10 are inserted into the shielding pipe 30 is achieved by placing the electric wires 10 along the inside of one divided body 20F or 20S of the pair of divided bodies 20F and 20S and then combining the other divided body 20F or 20S with that divided body 20F or 20S. Also, the pair of divided bodies 20F and 20S that are combined together are unlikely to be displaced from each other due to the overlapping fitting portions 61 provided at the joint portions 36, and therefore handling is easy when compared with a case where the pair of divided bodies 20F and 20S are displaced easily. Accordingly, the operations for manufacturing the shielded conductive path 60 can be performed easily.

Other Embodiments

The present application is not limited to the foregoing description and the embodiments that have been described using the drawings, and, for example, embodiments as described below are also embraced within the technical scope of the present application.

(1) In the above-described embodiments, the pair of divided bodies 20 may be kept in the combined state as a result of the shielding pipe 30 being bent and thereby plastically deformed into a predetermined shape. However, the present application is not limited to this, and a structure for keeping the pair of divided bodies together may also be provided separately. For example, it is possible to attach a clamp to the pair of divided bodies, to join the pair of divided bodies to each other by spot welding, or to wrap a metal band around the pair of divided bodies.

(2) In the above-described embodiments, the pair of divided bodies 20 are combined together before being bent. However, the present application is not limited to this, and a configuration may also be adopted in which the divided bodies that are bent into predetermined shapes in advance are combined together.

(3) In the above-described embodiments, the external shape of the shielding pipe 30 is a circle. However, the present application is not limited to this, and the external shape of the shielding pipe may be any suitable shape such as an ellipse, an oblong, a rectangle, or the like.

(4) In the above-described embodiments, the drain hole 33 is provided in the lowermost portion 31 of the shielding pipe 30. However, the present application is not limited to this, and the position at which a drain hole is provided and the number of drain holes can be set as appropriate.

(5) In the above-described embodiments, the overlapping fitting portions 23 (53) (61) or the multifunctional portions 24 are provided extending continuously over the entire length of the shielding pipe 30. However, the present application is not limited to this, and the overlapping fitting portions or the multifunctional portions may be provided in only a part of the shielding pipe, or may be provided discontinuously at a plurality of spaced-apart positions.

(6) In the above-described embodiments, the overlapping fitting portions 23 (53) (61) are formed on (only) the inner surface of the shielding pipe 30. However, the present application is not limited to this, and, although a conventional pipe bender cannot be used, the overlapping fitting portions may be provided protruding from the outer surface of the shielding pipe. In that case, for example, a configuration may be adopted in which flange portions protruding outward are provided in the first edge portion and the second edge portion of a divided body and the overlapping fitting portions are provided at those flange portions.

Figure 8:
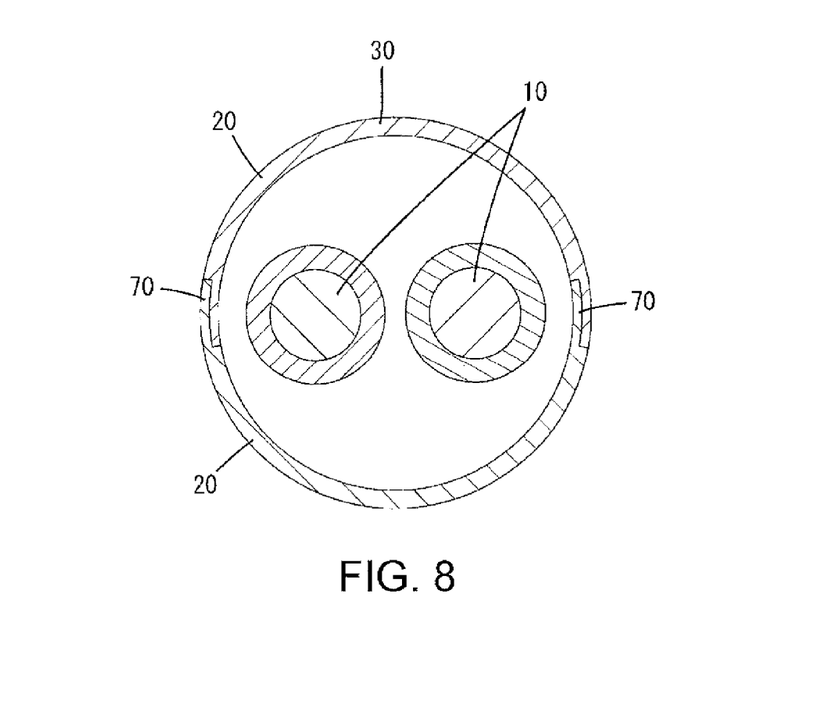
FIG. 8 is a cross-sectional view showing the configuration of a shielded conductive path according to (7) of the Other Embodiments section.

(7) In the above-described embodiments, the overlapping fitting portions 23 (53) (61) are formed on (only) the inner surface of the shielding pipe 30. However, the present application is not limited to this, and, for example, as shown in FIG. 8, overlapping fitting portions 70 may be formed within the range of the thickness of the shielding pipe 30 so as not to protrude from either of the inner surface and the outer surface of the shielding pipe 30. Moreover, at this time, it is not required that the overlapping fitting portions 70 overlap entirely in the inside outside direction. For example, the overlapping fitting portion to be disposed on the inner circumferential surface side of the shielding pipe 30 may have a smaller length in the circumferential direction than the overlapping fitting portion to be disposed to the outside thereof.

(8) In Embodiments 1 and 2 above, the leading end of each multifunctional portion 24 abuts against or is close to the inner circumferential surface of the counterpart divided body 20. However, the present application is not limited to this, and the leading end of each multifunctional portion may be located at a large distance from the inner circumferential surface of the counterpart divided body.

(9) In Embodiments 1 and 2 above, the multifunctional portions 24 that each serve as both the electric wire protecting portion and the closing portion are provided. However, the present application is not limited to this, and an electric wire protecting portion and a closing portion may be provided separately. In that case, a configuration may be adopted in which the electric wire protecting portion is provided inside the shielding pipe and the closing portion is provided outside the shielding pipe. Alternatively, only one of the electric wire protecting portion and the closing portion may be provided.

Figure 9:
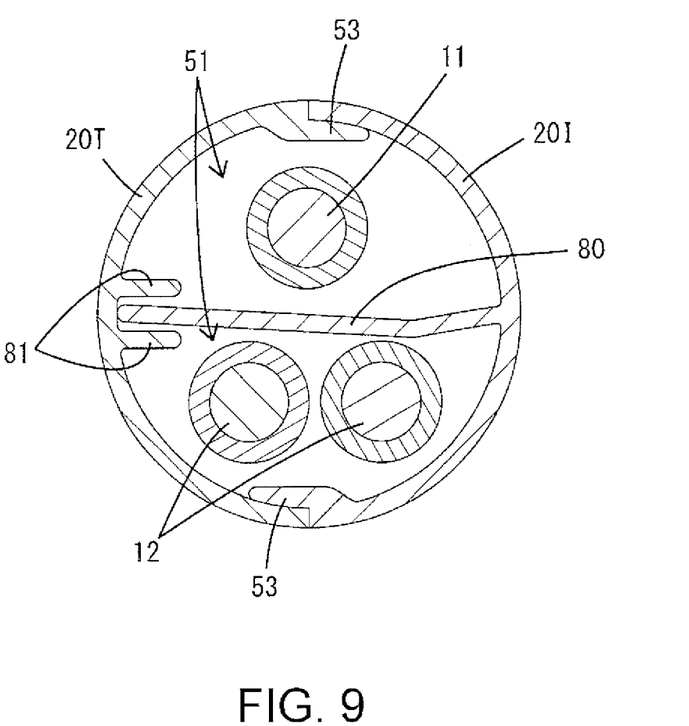
FIG. 9 is a cross-sectional view showing the configuration of a shielded conductive path according to (10) of the Other Embodiments section.

(10) In Embodiment 3 above, the partition wall 52 is formed by the partition constituent walls 54, which are provided in both of the pair of divided bodies 20, being joined to each other. However, the present application is not limited to this, and a configuration may also be adopted in which only one of the pair of divided bodies is provided with a partition constituent wall for partitioning the entire shielding pipe. In such a case, for example, it is possible to set the size of the partition constituent wall 54 of one of the divided bodies 20 described in Embodiment 3 above such that this partition constituent wall 54 is disposed abutting against or close to the inner circumferential surface of the other divided body 20 and to eliminate the partition constituent wall 54 of the other divided body 20. In that case, for example, as shown in FIG. 9, a partition constituent wall 80 of one divided body 20I may extend from the inner circumferential surface of the divided body 20I in a slightly oblique direction and be bent to the opposite side at an intermediate position, and a leading end of the partition constituent wall 80 may abut against another divided body 20T. Moreover, the other divided body 20T may be provided with a pair of partition holding portions 81 that are located so as to sandwich a protruding end portion of the partition constituent wall 80 therebetween and that hold the protruding end portion of the partition constituent wall 80 so as to prevent the protruding end portion from being bent into the upper or lower electric wire insertion space 51.

What is claimed is:

1. A shielded conductive path comprising:
    a shielding pipe having a tubular shape into which an electric wire can be inserted, the shielding pipe formed by combining together a pair of divided bodies, the shielding pipe being divided along an axis of the divided bodies; and
    an overlapping fitting portion that is provided at a joint portion of the pair of divided bodies and allows the pair of divided bodies to be fitted to each other while overlapping each other in an inside-outside direction when the pair of divided bodies are combined together, the overlapping fitting portion having an arc-shaped outer surface,
    wherein the shielding pipe is provided with an electric wire protecting portion that covers a corner portion of the overlapping fitting portion, the corner portion being formed inside the shielding pipe.

2. The shielded conductive path according to claim 1, wherein the overlapping fitting portion is formed on only an inner surface of the shielding pipe.

3. The shielded conductive path according to claim 1, wherein the shielding pipe is provided with a holding portion that holds a leading end of the electric wire protecting portion or the closing portion from an inner side.

4. The shielded conductive path according to claim 1, wherein the pair of divided bodies have the same shape.

5. The shielded conductive path according to claim 1,
    wherein the shielding pipe is provided with a partition constituent wall that partitions an interior of the shielding pipe into a plurality of electric wire insertion spaces, and
    the partition constituent wall is provided in only one of the pair of divided bodies and extends from an inner circumferential surface of said one divided body so as to partition an interior of said one divided body into the same number of spaces as the electric wire insertion spaces.

6. The shielded conductive path according to claim 1,
    wherein the shielding pipe is provided with a partition wall that partitions an interior of the shielding pipe into a plurality of electric wire insertion spaces, and
    the partition wall is formed by partition constituent walls that are provided in both of the pair of divided bodies being laid on top of each other when the pair of divided bodies are combined together, and leading end portions of the partition constituent walls are disposed overlapping each other.

7. The shielded conductive path according to claim 1, wherein the divided body has a drain hole that is formed from a side that constitutes an inner circumferential surface of the shielding pipe toward the opposite side.

8. The shielded conductive path according to claim 1, wherein an external shape of the shielding pipe is a circle.

9. The shielded conductive path according to claim 1, wherein the overlapping fitting portion has a flat inner surface.

10. A shielded conductive path comprising:
    a shielding pipe having a tubular shape into which an electric wire can be inserted, the shielding pipe formed by combining together a pair of divided bodies, the shielding pipe being divided along an axis of the divided bodies; and
    an overlapping fitting portion that is provided at a joint portion of the pair of divided bodies and allows the pair of divided bodies to be fitted to each other while overlapping each other in an inside-outside direction when the pair of divided bodies are combined together, the overlapping fitting portion having an arc-shaped outer surface,
    wherein the shielding pipe is provided with a closing portion that extends from one of the pair of divided bodies across the inside of the joint portion to the side of the other divided body.

11. The shielded conductive path according to claim 10, wherein the overlapping fitting portion is formed on only an inner surface of the shielding pipe.

12. The shielded conductive path according to claim 10, wherein the pair of divided bodies have the same shape.

13. The shielded conductive path according to claim 10, wherein the shielding pipe is provided with a partition constituent wall that partitions an interior of the shielding pipe into a plurality of electric wire insertion spaces, and the partition constituent wall is provided in only one of the pair of divided bodies and extends from an inner circumferential surface of said one divided body so as to partition an interior of said one divided body into the same number of spaces as the electric wire insertion spaces.

14. The shielded conductive path according to claim 10, wherein the shielding pipe is provided with a partition wall that partitions an interior of the shielding pipe into a plurality of electric wire insertion spaces, and the partition wall is formed by partition constituent walls that are provided in both of the pair of divided bodies being laid on top of each other when the pair of divided bodies are combined together, and leading end portions of the partition constituent walls are disposed overlapping each other.

15. The shielded conductive path according to claim 10, wherein the divided body has a drain hole that is formed from a side that constitutes an inner circumferential surface of the shielding pipe toward the opposite side.

16. The shielded conductive path according to claim 10, wherein an external shape of the shielding pipe is a circle.

17. The shielded conductive path according to claim 10, wherein the overlapping fitting portion has a flat inner surface.

\* \* \* \* \*